(12) United States Patent
Yun et al.

(10) Patent No.: US 12,361,983 B2
(45) Date of Patent: Jul. 15, 2025

(54) STORAGE DEVICES HAVING MULTI DROP STRUCTURE

(71) Applicant: Samsung Electronics Co., Ltd., Suwon-si (KR)

(72) Inventors: Jae-Sang Yun, Suwon-si (KR); Kwang Soo Park, Suwon-si (KR); Ji Woon Park, Suwon-si (KR); Bong Gyu Kang, Suwon-si (KR); Su-Jin Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 171 days.

(21) Appl. No.: 18/317,344

(22) Filed: May 15, 2023

(65) Prior Publication Data
US 2024/0127869 A1 Apr. 18, 2024

(30) Foreign Application Priority Data
Oct. 12, 2022 (KR) ................. 10-2022-0130228

(51) Int. Cl.
*G11C 5/06* (2006.01)
*G11C 5/14* (2006.01)
*G11C 7/10* (2006.01)

(52) U.S. Cl.
CPC .............. *G11C 7/1039* (2013.01); *G11C 5/06* (2013.01); *G11C 5/14* (2013.01); *G11C 7/1057* (2013.01); *G11C 7/1066* (2013.01); *G11C 7/1084* (2013.01); *G11C 7/1093* (2013.01)

(58) Field of Classification Search
CPC ........... G11C 7/1039; G11C 5/06; G11C 5/14; G11C 7/1057; G11C 7/1066; G11C 7/1084; G11C 7/1093

USPC ........................................................ 365/191
See application file for complete search history.

(56) References Cited

U.S. PATENT DOCUMENTS

| | | | |
|---|---|---|---|
| 7,274,583 B2 | 9/2007 | Park et al. | |
| 8,036,011 B2 | 10/2011 | Kim et al. | |
| 8,195,855 B2 | 6/2012 | Jeong et al. | |
| 10,998,904 B1 | 5/2021 | Agarwal et al. | |
| 11,200,190 B2 | 12/2021 | Zhao et al. | |
| 2005/0007805 A1* | 1/2005 | Ware ...................... | G11C 29/02 365/63 |
| 2009/0273960 A1* | 11/2009 | Kim ........................ | G11C 7/109 365/191 |

(Continued)

FOREIGN PATENT DOCUMENTS

JP H10187311 A 7/1998
KR 20000052441 A 8/2000

*Primary Examiner* — Ly D Pham
(74) *Attorney, Agent, or Firm* — Myers Bigel, P.A.

(57) ABSTRACT

A storage device having a multi drop structure is provided. The storage device comprises a storage controller configured to output a data signal, a first non-volatile memory configured to receive the data signal, a first wiring electrically connected to the storage controller and configured to transfer the data signal, a first termination module including a first impedance element that electrically connects the first wiring to at least one of a power voltage or a ground voltage, a second wiring electrically connected to the first wiring and configured to transfer the data signal to the first non-volatile memory, and a third wiring electrically connected to the first wiring and configured to transfer the data signal to the first termination module.

20 Claims, 27 Drawing Sheets

(56) References Cited

U.S. PATENT DOCUMENTS

| | | | |
|---|---|---|---|
| 2011/0205832 A1* | 8/2011 | Jeon | G11C 7/109 |
| | | | 326/30 |
| 2016/0124888 A1* | 5/2016 | Gervasi | G06F 13/4068 |
| | | | 710/301 |
| 2018/0131374 A1* | 5/2018 | Choi | H03K 19/0005 |
| 2021/0174861 A1* | 6/2021 | Kim | G06F 13/1668 |
| 2022/0414033 A1* | 12/2022 | Park | G06F 13/1689 |
| 2023/0016415 A1* | 1/2023 | Grunzke | G06F 12/0653 |

* cited by examiner

STORAGE DEVICES HAVING MULTI DROP STRUCTURE

CROSS-REFERENCE TO RELATED APPLICATION

This application claims priority from Korean Patent Application No. 10-2022-0130228 filed on Oct. 12, 2022 in the Korean Intellectual Property Office, and all the benefits accruing therefrom under 35 U.S.C. 119, the contents of which in its entirety are herein incorporated by reference.

BACKGROUND

Field

The present disclosure relates to storage devices having a multi drop structure.

Description of Related Art

In a solid-state drive (SSD) product with a multi drop structure, an interface speed inside the SSD product is important to satisfy high capacity and high performance. In the SSD product, a plurality of memory devices may be mounted and may be connected to a controller. However, depending on a capacity, at least one of the plurality of memory devices may not be mounted. Accordingly, noise that deteriorates Signal Integrity (SI) and Power Integrity (PI) characteristics of the memory may be generated.

SUMMARY

Aspects of the present disclosure provide storage devices with improved product reliability.

The present disclosure is not limited to the above-mentioned purpose. Other purposes and advantages according to the present disclosure that are not mentioned may be understood based on the following description, and may be more clearly understood based on embodiments according to the present disclosure. Further, it will be easily understood that the purposes and advantages according to the present disclosure may be realized using means illustrated in the claims and combinations thereof.

According to some aspects of the present disclosure, there is provided a storage device comprising a storage controller configured to output a data signal, a first non-volatile memory configured to receive the data signal, a first wiring electrically connected to the storage controller and configured to transfer the data signal, a first termination module including a first impedance element that electrically connects the first wiring to at least one of a power voltage or a ground voltage, a second wiring electrically connected to the first wiring and configured to transfer the data signal to the first non-volatile memory, and a third wiring electrically connected to the first wiring and configured to transfer the data signal to the first termination module.

According to some aspects of the present disclosure, there is provided a storage device comprising a storage controller configured to output a data signal, a first non-volatile memory configured to receive the data signal, a first wiring electrically connected to the storage controller and configured to transfer the data signal, a first termination module that electrically connects the first wiring to an open stub, a second wiring electrically connected to the first wiring and configured to transfer the data signal to the first non-volatile memory, and a third wiring electrically connected to the first wiring and configured to transfer the data signal to the first termination module.

According to some aspects of the present disclosure, there is provided a storage device comprising a storage controller configured to output a data signal, a first non-volatile memory configured to receive the data signal, a first wiring electrically connected to the storage controller and configured to transfer the data signal, a second wiring that electrically connects the first wiring and the first non-volatile memory to each other, a third wiring electrically connected to the first wiring and physically separated from the second wiring, a first termination module including a first impedance element that electrically connects the first wiring to a power voltage, and a second impedance element that electrically connects the first wiring to a ground voltage, a fourth wiring that electrically connects the first wiring and the first termination module to each other, and a fifth wiring electrically connected to the first wiring and physically separated from the fourth wiring.

It should be noted that the effects of the present disclosure are not limited to those described above, and other effects of the present disclosure will be apparent from the following description.

BRIEF DESCRIPTION OF DRAWINGS

The above and other aspects and features of the present disclosure will become more apparent by describing in detail example embodiments thereof with reference to the attached drawings, in which.

DETAILED DESCRIPTION

Figure 1:
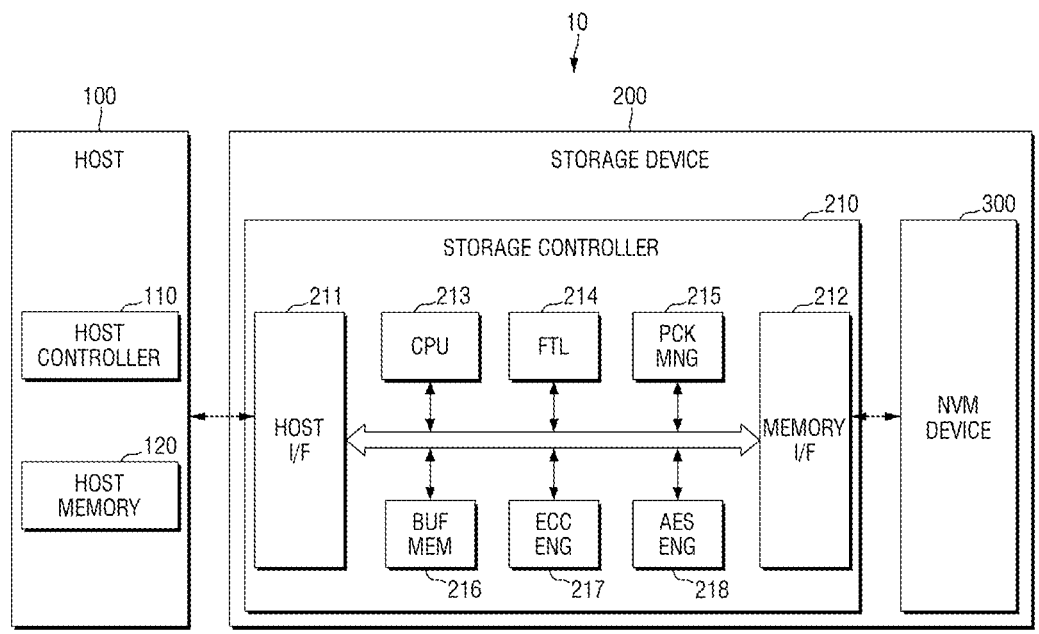
FIG. 1 is a block diagram illustrating a storage system according to some embodiments.

For simplicity and clarity of illustration, elements in the drawings are not necessarily drawn to scale. The same reference numbers in different drawings represent the same or similar elements, and as such perform similar functions. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the scope of the present disclosure as defined by the appended claims.

A shape, a size, a ratio, an angle, a number, etc. disclosed in the drawings for illustrating embodiments of the present disclosure are illustrative, and the present disclosure is not limited thereto. The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify an entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the scope of the present disclosure.

In addition, it will also be understood that when a first element or layer is referred to as being present "on" or "beneath" a second element or layer, the first element may be directly on or beneath the second element or may be indirectly on or beneath the second element with a third element or layer being between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be "on" or "on a top" of another layer, film, region, plate, or the like, the former may directly contact the latter or still another layer, film, region, plate, or the like may be between the former and the latter. As used herein, when a layer, film, region, plate, or the like is directly "on" or "on a top" of another layer, film, region, plate, or the like, the former directly contacts the latter and still another layer, film, region, plate, or the like is not between the former and the latter. Further, as used herein, when a layer, film, region, plate, or the like may be "below" or "under" another layer, film, region, plate, or the like, the former may directly contact the latter or still another layer, film, region, plate, or the like may be between the former and the latter. As used herein, when a layer, film, region, plate, or the like is directly "below" or "under" another layer, film, region, plate, or the like, the former directly contacts the latter and still another layer, film, region, plate, or the like is not between the former and the latter.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Hereinafter, example embodiments of the present disclosure will be described with reference to the accompanying drawings.

FIG. 1 is a block diagram illustrating a storage system according to some embodiments.

Referring to FIG. 1, a storage system 10 may include a host 100 and a storage device 200. Further, the storage device 200 may include a storage controller 210 and a non-volatile memory device (NVM device) 300. Further, in some embodiments, the host 100 may include a host controller 110 and a host memory 120. The host memory 120 may function as a buffer memory for temporarily storing therein data to be transmitted to the storage device 200 or data transmitted from the storage device 200.

The storage device 200 may include storage media for storing therein data according to a request from the host 100. In one example, the storage device 200 may include at least one of an SSD (Solid-State Drive), an embedded memory, or a removable external memory. When the storage device 200 is embodied as the SSD, the storage device 200 may be a device complying to a NVMe (non-volatile memory express) standard. When the storage device 200 is embodied as the embedded memory or the external memory, the storage device 200 may be a device complying to a UFS (universal flash storage) or eMMC (embedded multi-media card) standard. Each of the host 100 and the storage device 200 may generate a packet according to an adopted standard protocol and transmit the generated packet.

When the non-volatile memory device 300 of the storage device 200 includes a flash memory, the flash memory may include a 2D NAND memory array or a 3D (or vertical) NAND (VNAND) memory array. In another example, the storage device 200 may include various other types of non-volatile memories. For example, the storage device 200 may include MRAM (Magnetic Random-Access Memory), Spin-Transfer Torque MRAM, Conductive bridging RAM (CBRAM), FeRAM (Ferroelectric RAM), PRAM (Phase RAM), Resistive RAM, and other various types of memories.

According to some embodiments, the host controller 110 and the host memory 120 may be implemented as separate semiconductor chips. Alternatively, in some embodiments, the host controller 110 and the host memory 120 may be integrated into the same semiconductor chip. In an example, the host controller 110 may be one of a plurality of modules included in an application processor, and the application processor may be implemented in a system-on-chip (SoC) manner. Further, the host memory 120 may be an embedded memory in the application processor or a non-volatile memory or a memory module outside the application processor.

The host controller 110 may manage an operation of storing data (for example, write data) of a buffer area of the host memory 120 in the non-volatile memory device 300, or an operation of storing data (for example, read data) of the non-volatile memory device 300 in the buffer area.

The storage controller 210 may include a host interface 211, a memory interface 212 and a CPU (central processing unit) 213. Further, the storage controller 210 may include a FTL (Flash Translation Layer) 214, a packet manager 215, a buffer memory 216, an ECC (error correction code) engine 217, and an AES (advanced encryption standard) engine 218. The storage controller 210 may further include a working memory (not shown) into which the flash translation layer (FTL) 214 is loaded. The operation of writing and reading data to and from the non-volatile memory device 300 may be controlled by the CPU 213 executing the flash translation layer 214.

The host interface 211 may transmit and receive the packet to and from the host 100. The packet transmitted from the host 100 to the host interface 211 may include a command or data to be written to the non-volatile memory device 300. The packet transmitted from the host interface 211 to the host 100 may include a response to the command or data read from the non-volatile memory device 300. The memory interface 212 may transmit data to be written to the non-volatile memory device 300 to the non-volatile memory device 300 or receive data read from the non-volatile memory device 300 therefrom. The memory interface 212 may be implemented to comply with a standard protocol such as a toggle or ONFI (Open NAND Flash Interface).

The flash translation layer 214 may perform several functions, such as address mapping, wear-leveling, and garbage collection. The address mapping refers to an operation that converts a logical address received from the host 100 into a physical address used to actually store data in the non-volatile memory 300. The wear-leveling refers to a technique to ensure that blocks in the non-volatile memory device 300 are used uniformly to prevent excessive degradation of a specific block. In one example, the wear-leveling may be implemented via a firmware technique that balances erase counts of physical blocks. The garbage collection refers to a technique to copy valid data of an existing block to a new block and then erase the existing block to secure available capacity in the non-volatile memory device 300.

The packet manager 215 may generate the packet according to a protocol of an interface which the host 100 and the packet manager 215 agree to use, or may parse various information from the packet received from the host 100. Further, the buffer memory 216 may temporarily store therein data to be written to the non-volatile memory device 300 or data to be read from the non-volatile memory device 300. The buffer memory 216 may have a component present in the storage controller 210, or may be outside the storage controller 210 (e.g., external to the storage controller 210).

The ECC engine 217 may perform an error detection and correction function on read data read from the non-volatile memory device 300. More specifically, the ECC engine 217 may generate parity bits related to write data to be written into the non-volatile memory device 300. Then, the generated parity bits together with the write data may be stored in the non-volatile memory device 300. In reading the read data from the non-volatile memory device 300, the ECC engine 217 may correct an error in the read data using the parity bits read from the non-volatile memory device 300, and may output the error-corrected read data.

The AES engine 218 may perform at least one of an encryption operation or a decryption operation on data input to the storage controller 210 using a symmetric-key algorithm.

Figure 2:
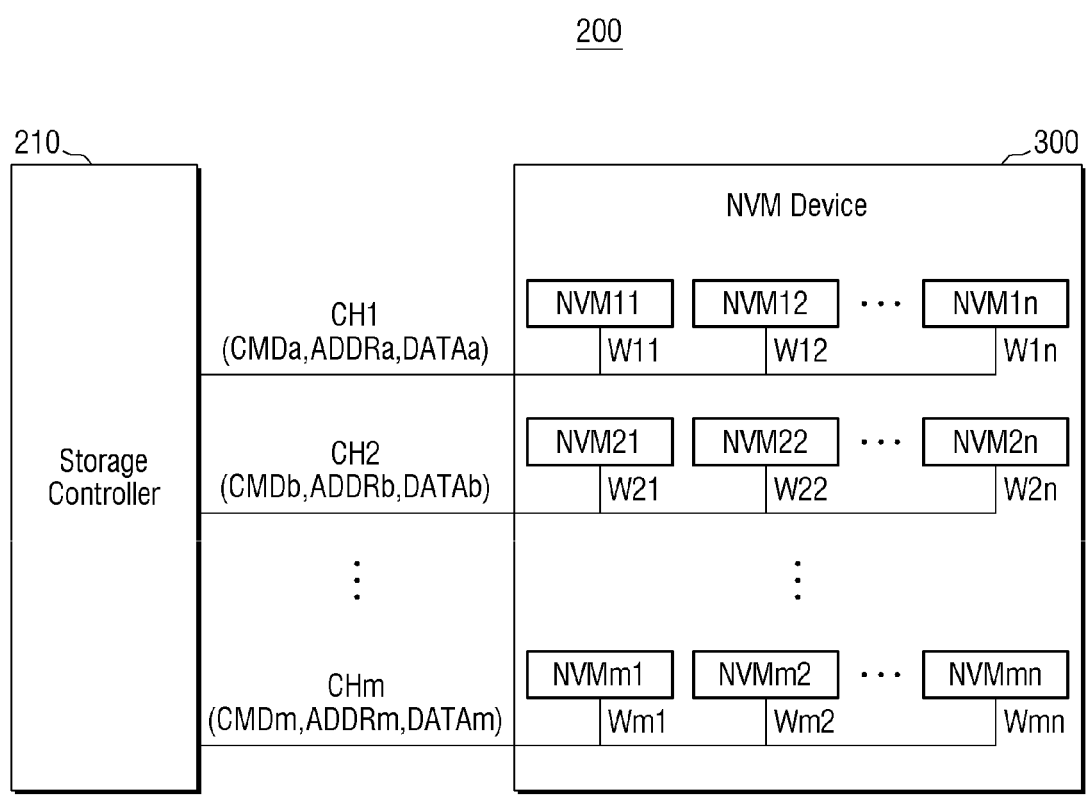
FIG. 2 is a block diagram for illustrating a storage device according to some embodiments.

FIG. 2 is a block diagram for illustrating a storage device according to some embodiments.

Referring to FIG. 2, the non-volatile memory device 300 and the storage controller 210 may be connected to each other via a plurality of channels CH1 to CHm. For example, the storage device 200 may be embodied as a storage device such as an SSD.

The non-volatile memory device 300 may include a plurality of non-volatile memory devices NVM11 to NVMmn. Each of the non-volatile memory devices NVM11 to NVMmn may be connected to one of the plurality of channels CH1 to CHm via a corresponding way. For example, the non-volatile memory devices NVM11 to NVM1n may be connected to the first channel CH1 via respective ways W11 to W1n. The non-volatile memory devices NVM21 to NVM2n may be connected to the second channel CH2 via respective ways W21 to W2n. In some embodiments, each of the non-volatile memory devices NVM11 to NVMmn may be implemented on a memory basis capable of operating according to an individual command from the storage controller 210. For example, each of the non-volatile memory devices NVM11 to NVMmn may be implemented on a chip basis or a die basis. However, the present disclosure is not limited thereto.

The storage controller 210 may transmit/receive signals to and from the non-volatile memory device 300 via the plurality of channels CH1 to CHm. For example, the storage controller 210 may transmit commands CMDa to CMDm, addresses ADDRa to ADDRm, and data DATAa to DATAm to the non-volatile memory device 300 via the channels CH1 to CHm, or may receive the data DATAa to DATAm from the non-volatile memory device 300.

The storage controller 210 may select one of the non-volatile memory devices NVM11 to NVMmn connected to each corresponding channel via each corresponding channel, and may transmit/receive signals to/from the selected non-volatile memory device.

The storage controller 210 may transmit and receive signals to and from the non-volatile memory device 300 in a parallel manner via different channels. For example, the storage controller 210 may transmit the command CMDb to the non-volatile memory device NVM21 via the second channel CH2 while transmitting the command CMDa to the non-volatile memory device NVM11 via the first channel CH1. For example, the storage controller 210 may receive the data DATAb from the non-volatile memory device NVM21 via the second channel CH2 while receiving the data DATAa from the non-volatile memory device NVM11 via the first channel CH1.

FIG. 2 illustrates that the non-volatile memory device 300 communicates with the storage controller 210 via m channels, and n non-volatile memory devices of the non-volatile memory device 300 correspond to one channel. The number of channels and the number of non-volatile memory devices corresponding to one channel may be variously modified.

Figure 3:
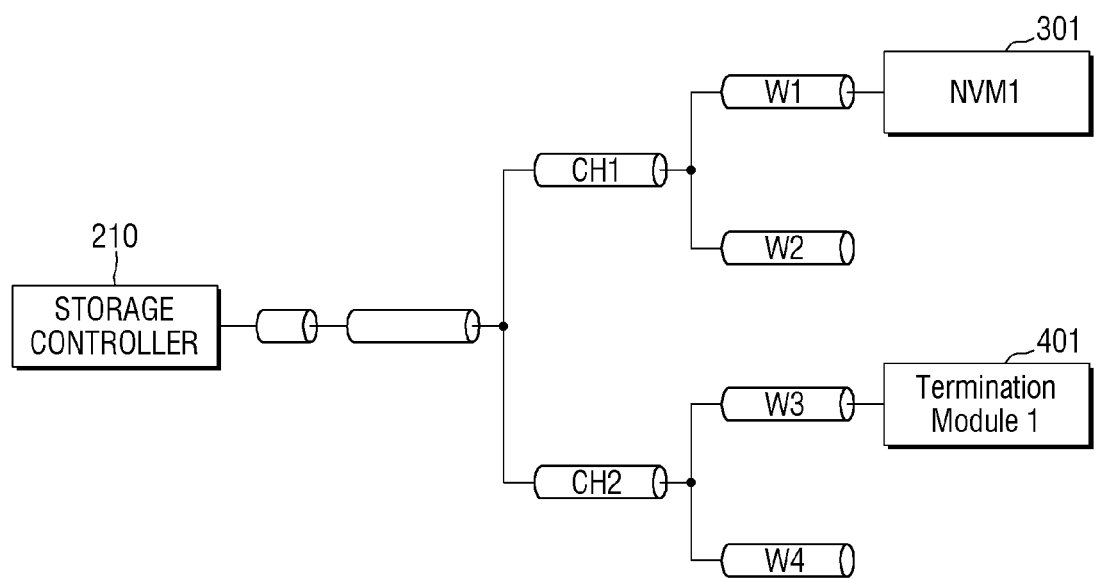
FIG. 3 is a block diagram for illustrating a storage device according to some embodiments.

FIG. 3 is a block diagram for illustrating a storage device according to some embodiments.

Referring to FIG. 3, the storage controller 210 and a first non-volatile memory device (NVM1) 301 may be connected to each other, for example, in a 1:4 multi-drop structure. For example, the storage controller 210 may be connected to a plurality of ways w1 to w4 via two channels CH1 and CH2. In some embodiments, each of the channels CH1 and CH2 may be implemented as a strip line, and each of the ways w1 to w4 may be implemented as a micro strip line. However, embodiments are not limited thereto. For example, the storage controller 210 may be connected to each of the first and second channels CH1 and CH2 via a wiring (not labeled). The wiring may be, for example, connected between the storage controller 210 and the first and second channels CH1 and CH2. As used herein, the first channel CH1, the second channel CH2, the first way w1, the second way w2, the third way w3, and the fourth way w4 may also be referred to as wirings. For example, the wiring (e.g., the wiring connected between the storage controller 210 and the first and second channels CH1 and CH2) may be referred to as a first wiring, the first and second channels CH1 may be referred to as second and third wirings, respectively, and the first, second, third, and fourth ways w1, w2, w3, and w4 may be referred to as fourth, fifth, sixth, and seventh wirings, respectively. However, the wiring, the first and second channels CH1 and CH2, and the plurality of ways w1 to w4 are not limited by these terms and may be termed differently. For example, a sixth wiring could also be termed a seventh wiring, and a seventh wiring could also be termed a sixth wiring.

Further, in some embodiments, the first channel CH1 may be connected to the first way w1 and the second way w2, and the second channel CH2 may be connected to the third way w3 and the fourth way w4. Further, the first non-volatile memory device (NVM1) 301 may be connected to one of the first channel CH1 or the second channel CH2 via one of the plurality of ways w1 to w4. The second way w2 may be physically separated from the first way w1, and the fourth way w4 may be physically separated from the third way w3.

In some embodiments, the first non-volatile memory device (NVM1) 301 may be connected to the first channel CH1 via the first way w1 as shown in FIG. 3. Further, in some embodiments, a first termination module (Termination Module 1) 401 may be connected to the second channel CH2 via the third way w3.

Hereinafter, with reference to FIGS. 4, 5, and 6A to 6E, embodiments in which the first termination module 401 is mounted on the storage device will be described in more detail.

Figure 4:
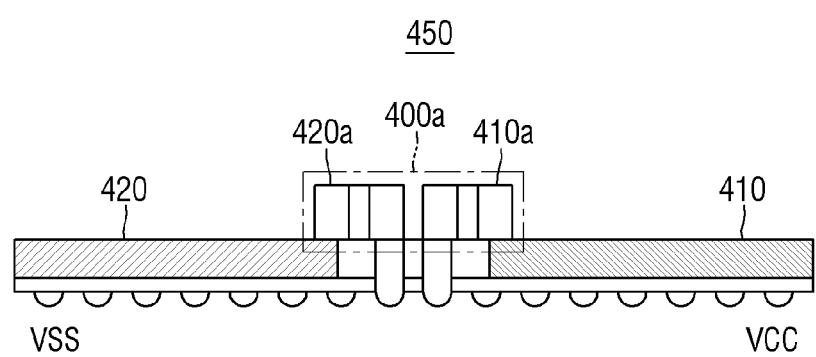
FIG. 4 is a cross-sectional view showing a printed circuit board on which a termination module is mounted according to some embodiments.
Figure 5:
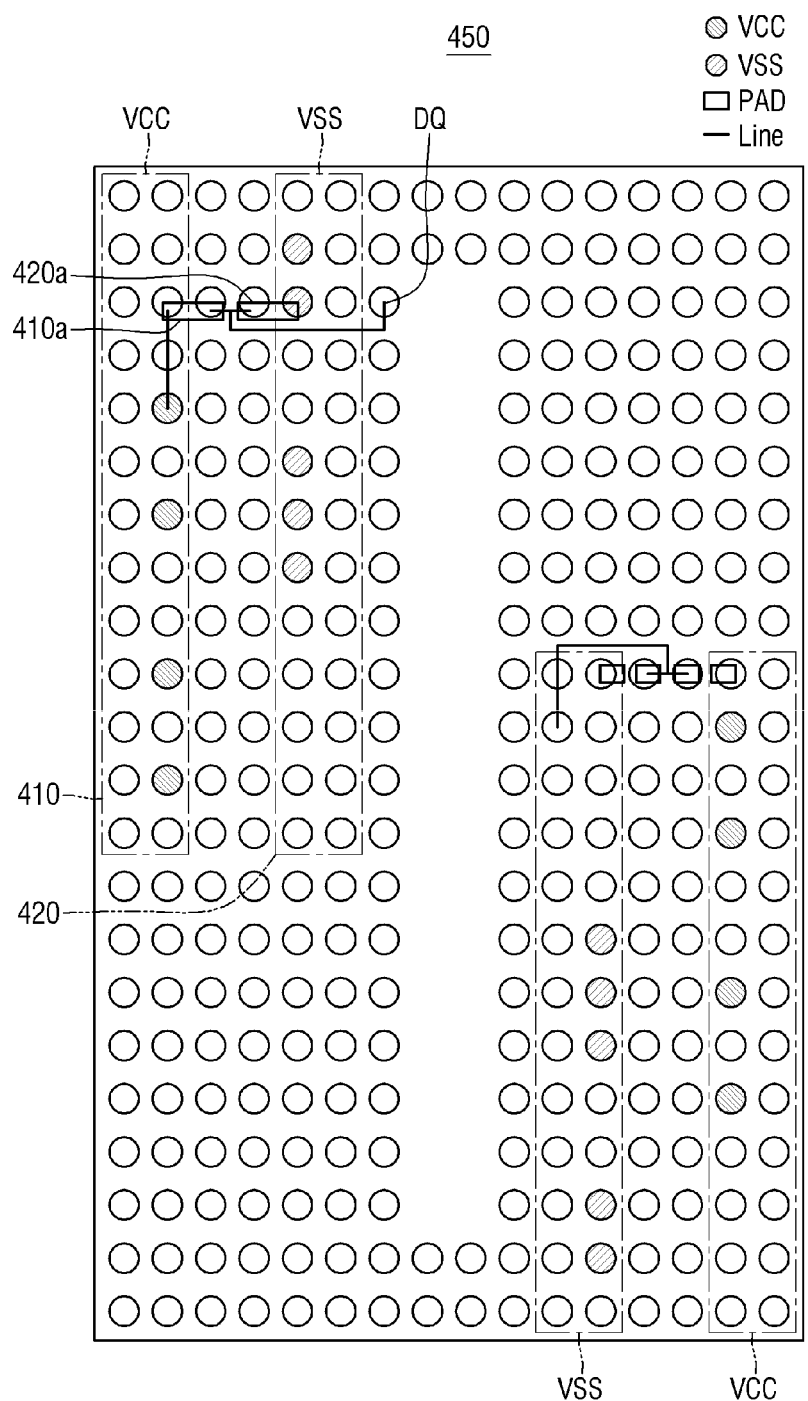
FIG. 5 is a plan view showing a printed circuit board on which a termination module is mounted according to some embodiments.

FIG. 4 is a cross-sectional view showing a printed circuit board on which a termination module is mounted according to some embodiments. FIG. 5 is a plan view showing a printed circuit board on which a termination module is mounted according to some embodiments. FIGS. 6A to 6E are circuit diagrams illustrating a termination module according to some embodiments.

Referring to FIGS. 3, 4, 5, and 6A, the first termination module 401 shown in FIG. 3 may be a CTT (Center Tap Termination)-type termination module shown in FIG. 4. Further, the CTT-type termination module may include a first wiring structure 410, a second wiring structure 420, and an impedance structure 400a as shown in FIG. 4.

The impedance structure 400a may include a first impedance element 410a and a second impedance element 420a.

The first impedance element 410a may be mounted on a pad PAD of the printed circuit board 450, and may connect a data ball DQ of a printed circuit board 450 to which a data signal transmitted from the storage controller 210 is input and the first wiring structure 410 to each other. In some embodiments, the first impedance element 410a may have an impedance value of Z1 as shown in FIG. 6.

The second impedance element 420a may be mounted on a pad PAD of the printed circuit board 450, and may connect a data ball DQ of the printed circuit board 450 to which a data signal transmitted from the storage controller 210 is input and the second wiring structure 420 to each other. In some embodiments, the second impedance element 420a may have an impedance value of Z2 as shown in FIG. 6.

The first wiring structure 410 may include at least one wiring connecting the first impedance element 410a and a ball of the printed circuit board 450 receiving a power voltage VCC to each other. The second wiring structure 420 may include at least one wiring connecting the second impedance element 420a and a ball of the printed circuit board 450 receiving a ground voltage VSS.

When the storage controller 210 transmits/receives signals to and from the first non-volatile memory (NVM1) 301 via the first channel CHL some signals may flow to the first termination module 401 via the second channel CH2. At this time, when the first termination module 401 is the CTT-type termination module, the first termination module 401 may be configured such that signals received by the first termination module 401 may flow to the power voltage VCC and the ground voltage VSS, as shown in FIG. 6A.

Figure 6A:
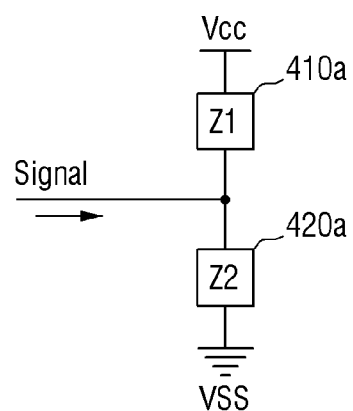
FIGS. 6A to 6E are circuit diagrams illustrating a termination module according to some embodiments.
Figure 6B:
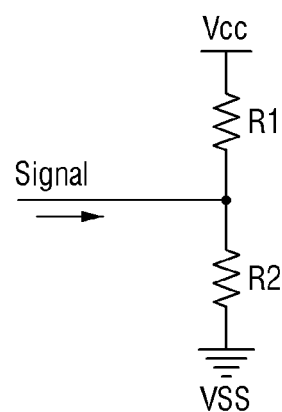

Referring to FIGS. 6A and 6B, in some embodiments, the first impedance element 410a may have a resistance value of R1, and the second impedance element 420a may have a resistance value of R2.

Figure 6C:
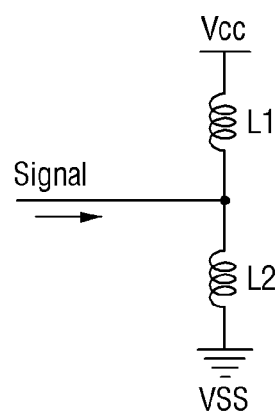

Referring to FIGS. 6A and 6C, in some embodiments, the first impedance element 410a may have an inductance of L1, and the second impedance element 420a may have an inductance of L2.

Figure 6D:
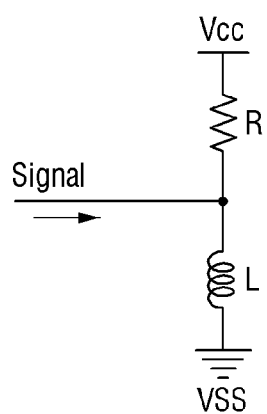

Referring to FIGS. 6A and 6D, in some embodiments, the first impedance element 410a connected to the power voltage VCC may have a resistance value of R, and the second impedance element 420a connected to the ground voltage VSS may have an inductance of L.

Figure 6E:
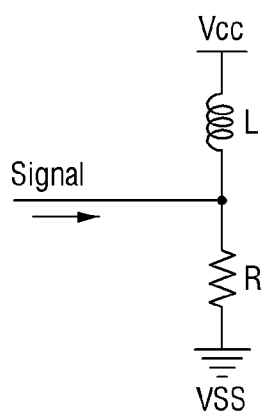

Referring to FIGS. 6A and 6E, in some embodiments, the first impedance element 410a connected to the power voltage VCC may have an inductance of L, and the second impedance element 420a connected to the ground voltage VSS may have a resistance value of R.

Hereinafter, with reference to FIGS. 7A, 7B, 8A, and 8B, an effect of the termination module will be described.

FIGS. 7A, 7B, 8A, and 8B are diagrams for illustrating an effect of a termination module according to some embodiments.

Figure 7A:
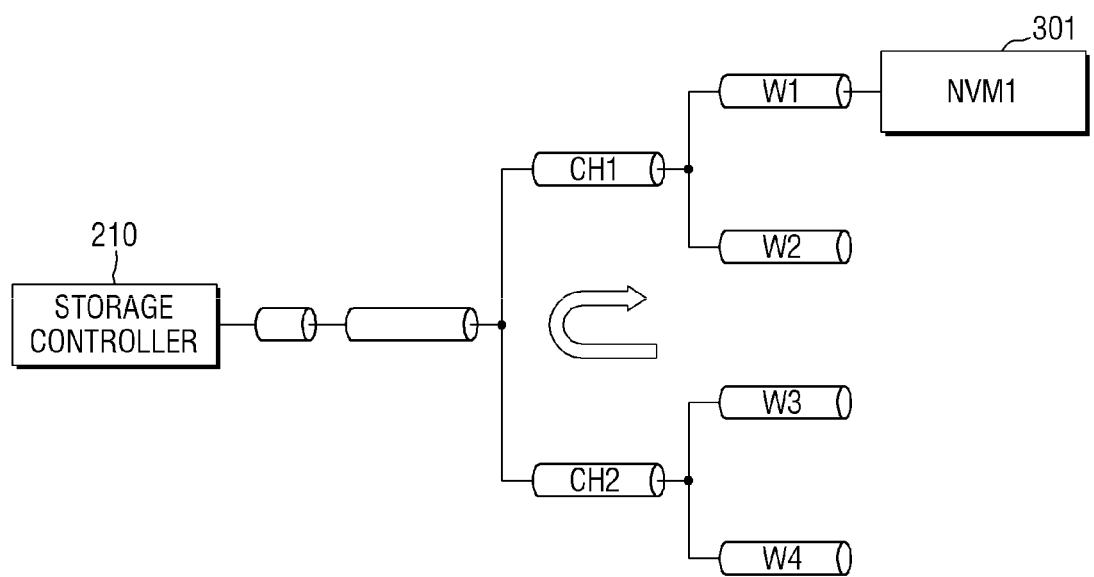
FIGS. 7A, 7B, 8A, and 8B are diagrams for illustrating an effect of a termination module according to some embodiments.

As shown in FIG. 7A, when the storage controller 210 transmits/receives signals to and from the first non-volatile memory (NVM1) 301 via the first channel CHL a memory device may not be mounted onto each of a plurality of ways w2 to w4. In some embodiments, some of the signals transmitted from the storage controller 210 may flow to an end of each of the plurality of ways w2 to w4 on which the memory device is not mounted. Further, some of the signals may be reflected from the end of each of the plurality of ways w2 to w4 and may be mixed with a signal transmitted from the storage controller 210 to the first non-volatile memory (NVM1) 301 and the mixed signal may be transmitted to the first non-volatile memory (NVM1) 301. In this case, for example, referring to FIG. 8A, an eye diagram showing a signal quality of the first non-volatile memory (NVM1) 301 indicates a state in which noise that deteriorates SI (Signal Integrity) and PI (Power Integrity) of the first non-volatile memory (NVM1) 301 is generated. Accordingly, a waveform with degraded eye time and voltage margin characteristics may occur.

Figure 7B:
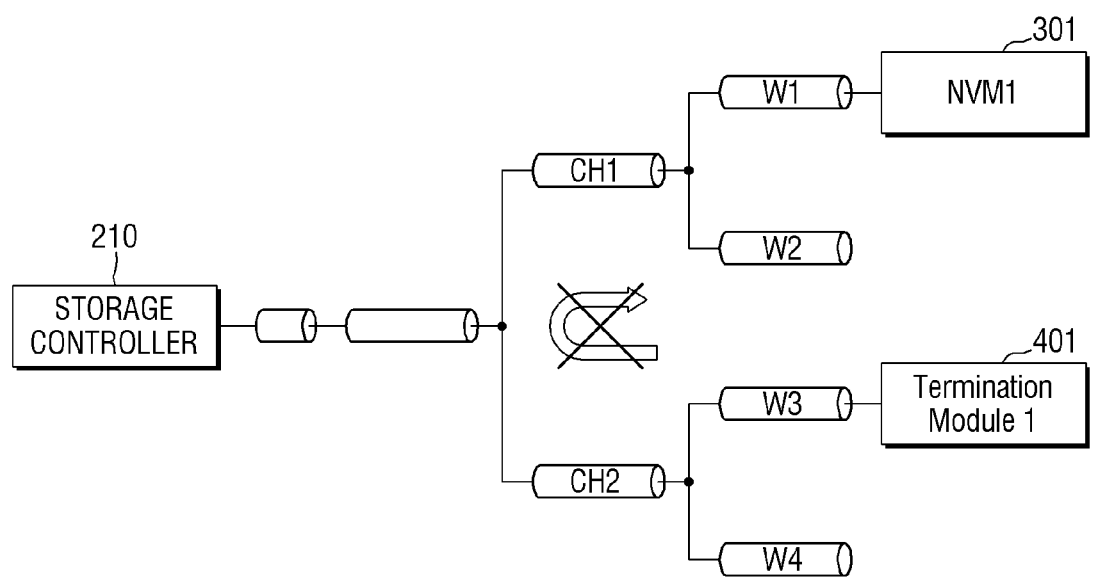
Figure 8A:
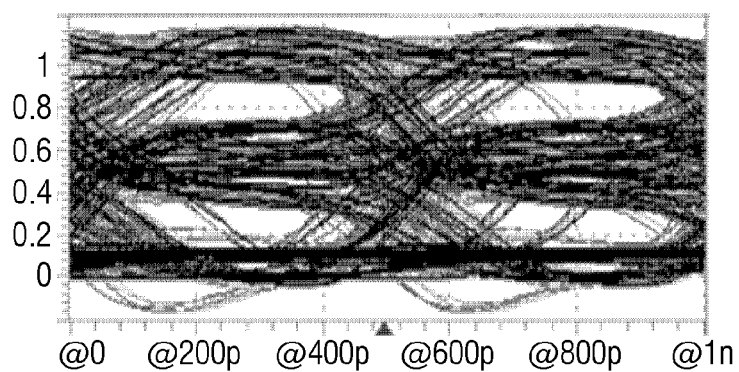
Figure 8B:
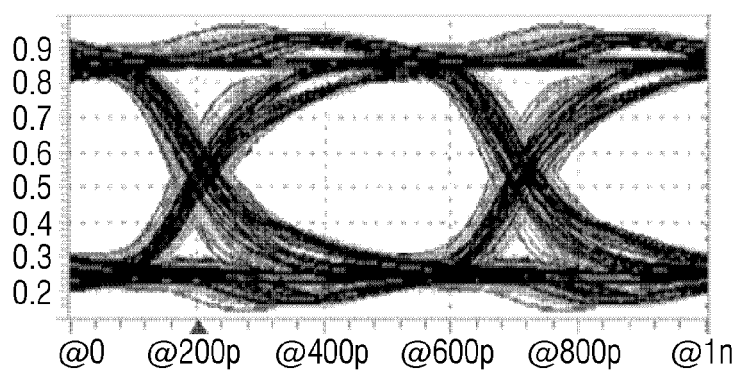

Referring to FIG. 7B, in the 1:4 multi-drop connection structure of the storage controller 210 and the first non-volatile memory (NVM1) 301 as shown in FIG. 7A, the first termination module 401 may be mounted on an end of one of a plurality of ways w3 and w4 which are connected to the second channel CH2 and on which the memory devices are not mounted, respectively. In some embodiments, the first termination module 401 may be mounted on an end of the third way w3. Further, for example, when a signal is transmitted from the storage controller 210 to the first non-volatile memory (NVM1) 301, a portion of the signal may be absorbed to the first termination module 401 via the second channel CH2.

Accordingly, as shown in FIG. 7B, reflection of the signal from the end of each of the plurality of ways w2 to w4 may be reduced. Therefore, referring to FIG. 8B, the eye diagram showing the signal quality of the first non-volatile memory (NVM1) 301 indicates a state in which the noise that deteriorates the SI (Signal Integrity) and the PI (Power Integrity) of the first non-volatile memory (NVM1) 301 is cancelled. Therefore, a waveform with improved eye time and voltage margin characteristics compared to that of FIG. 8A may occur.

Figure 9:
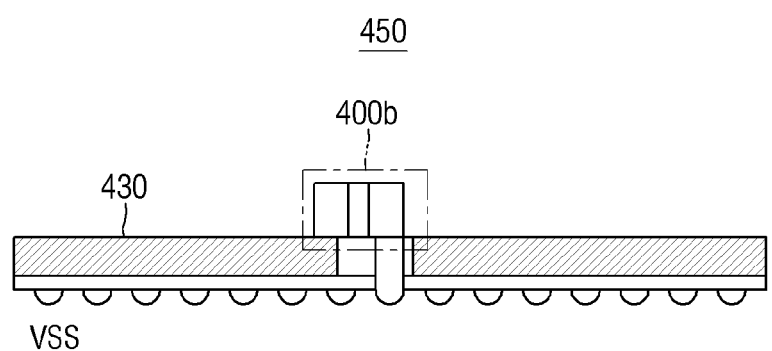
FIG. 9 is a cross-sectional view showing a printed circuit board on which a termination module is mounted according to some embodiments.
Figure 10:
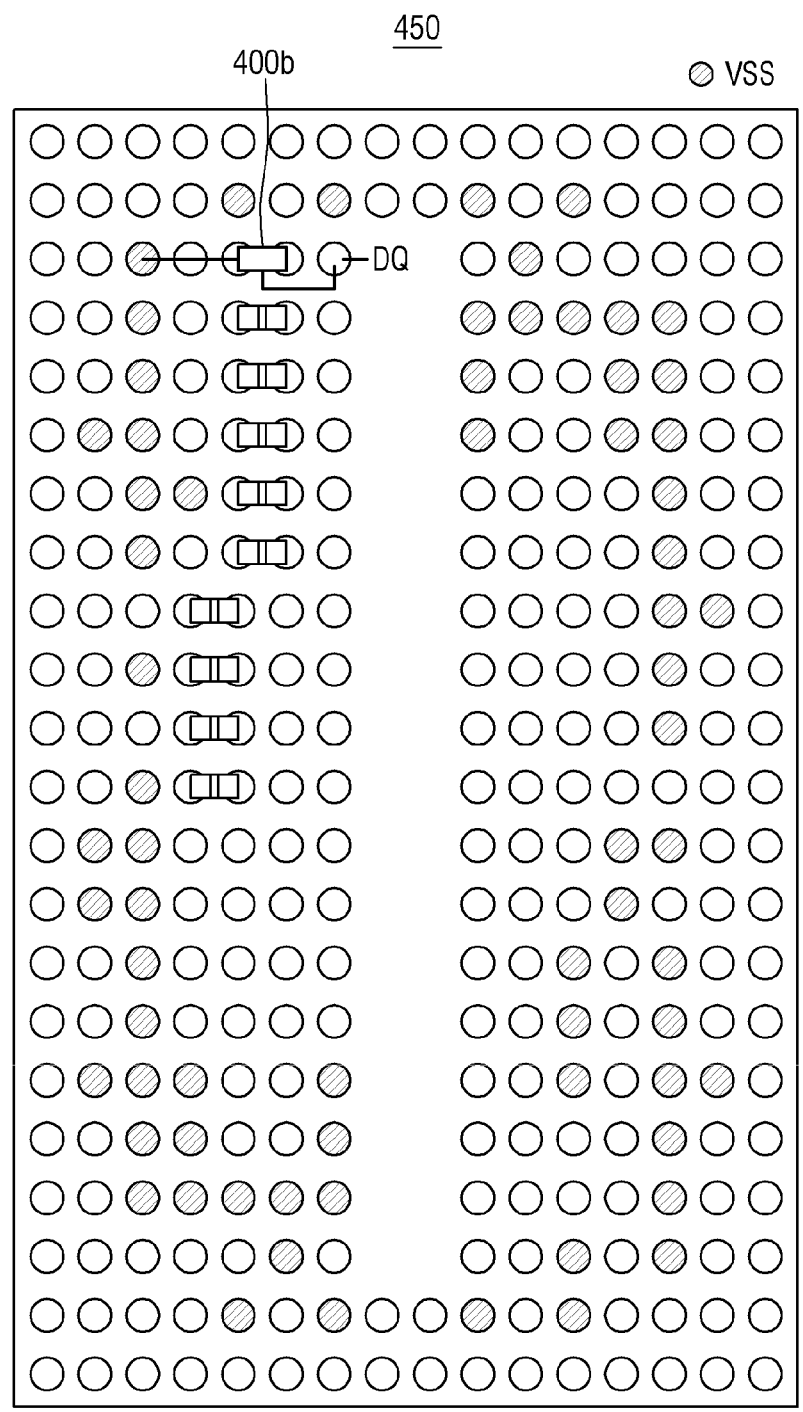
FIG. 10 is a plan view showing a printed circuit board on which a termination module is mounted according to some embodiments.
Figure 11A:
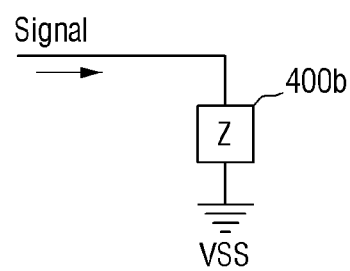
FIGS. 11A to 11C are circuit diagrams illustrating a termination module according to some embodiments.
Figure 11B:
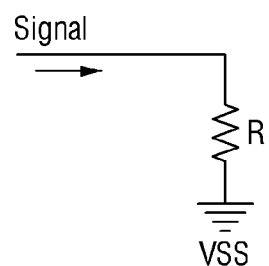
Figure 11C:
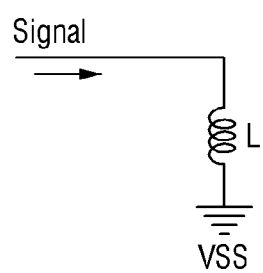

FIG. 9 is a cross-sectional view showing a printed circuit board on which a termination module is mounted according to some embodiments. FIG. 10 is a plan view showing a printed circuit board on which a termination module is mounted according to some embodiments. FIGS. 11A to 11C are circuit diagrams illustrating a termination module according to some embodiments. Hereinafter, descriptions redundant with the above description will be omitted.

Referring to FIGS. 3 and 9, the first termination module 401 as shown in FIG. 3 may be an LTT (Low Tap Termination)-type termination module shown in FIG. 9. Further, the LTT-type termination module may include a wiring structure 430 and an impedance element 400b as shown in FIG. 9.

Referring to FIGS. 3, 9 and 10, the impedance element 400b may be mounted on a pad PAD (not shown) of the printed circuit board 450 and may connect the data ball DQ of the printed circuit board 450 to which the data signal transmitted from the storage controller 210 is input and the wiring structure 430 to each other. In some embodiments, the impedance element 400b may have an impedance value of Z as shown in FIG. 11A.

The wiring structure 430 may include at least one wiring connecting the impedance element 400b and the ball of the printed circuit board 450 receiving the ground voltage VSS.

When the storage controller 210 transmits/receives signals to and from the first non-volatile memory (NVM1) 301 via the first channel CHL some of the signals may flow to the first termination module 401 via the second channel CH2. In this case, when the first termination module 401 is the LTT-type termination module including the impedance element 400b connected to the ground voltage VSS, the first termination module 401 may be configured such that the signals received by the first termination module 401 may flow to the ground voltage VSS as shown in FIG. 11A.

Referring to FIGS. 11A and 11B, in some embodiments, the impedance element 400b may have a resistance value of R.

Referring to FIGS. 11A and 11C, in some embodiments, the impedance element 400b may have an inductance of L.

Further, in some embodiments, in the 1:4 multi drop structure in which the storage controller 210 transmits and receives signals to and from the first non-volatile memory (NVM1) 301 as shown in FIG. 3, the LTT-type termination module including the impedance element connected to the ground voltage VS S may be mounted on an end of a way on which the memory device is not mounted. Thus, the same effect as that as described above with reference to FIGS. 7A, 7B, 8A, and 8B may be obtained.

Figure 12A:
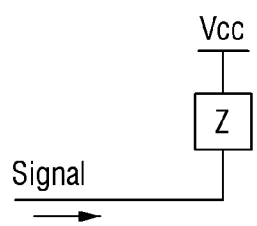
FIGS. 12A to 12C are circuit diagrams illustrating a termination module according to some embodiments.
Figure 12B:
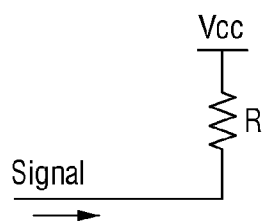
Figure 12C:
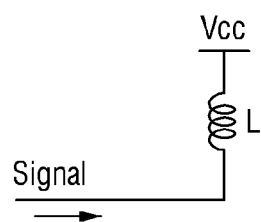

FIGS. 12A to 12C are circuit diagrams illustrating a termination module according to some embodiments. Hereinafter, descriptions redundant with the above description will be omitted.

In some embodiments, the LTT-type termination module may have a structure in which the impedance element is connected to the power voltage VCC rather than the ground voltage VSS as shown in FIG. 12A. Further, as shown in FIG. 3, when the storage controller 210 transmits and receives signals to and from the first non-volatile memory (NVM1) 301 through the first channel CH1, some of the signals may flow through the second channel CH2 to the first termination module 401. At this time, when the first termination module 401 is the LTT-type termination module including the impedance element connected to the power voltage VCC, the first termination module 401 may be configured such that the signals received by the first termination module 401 may flow to the power voltage VCC as shown in FIG. 12A.

Referring to FIGS. 12A and 12B, in some embodiments, the impedance element Z may have a resistance value of R.

Referring to FIGS. 12A and 12C, in some embodiments, the impedance element Z may have an inductance of L.

Further, in some embodiments, in the 1:4 multi-drop structure in which the storage controller 210 transmits and receives signals to and from the first non-volatile memory (NVM1) 301, as shown in FIG. 3, an LTT-type termination module including the impedance element connected to the power voltage VCC may be mounted on an end of a way on which the memory device is not mounted. Thus, the same effect as that as described above with reference to FIGS. 7A, 7B, 8A, and 8B may be obtained.

Figure 13:
FIG. 13 is a circuit diagram showing an open stub according to some embodiments.
Figure 14:
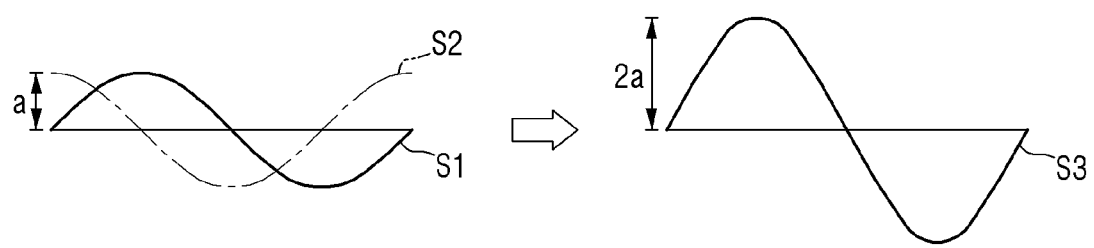
FIG. 14 is a waveform diagram showing a signal waveform of a memory device according to some embodiments.

FIG. 13 is a circuit diagram showing an open stub according to some embodiments. Hereinafter, descriptions redundant with the above description will be omitted. FIG. 14 is a waveform diagram showing a signal waveform of a memory device according to some embodiments.

Referring to FIGS. 3 and 13, the first termination module 401 as shown in FIG. 3 may be embodied as an open stub as shown in FIG. 13. For example, the open stub may be a branch from a wiring that transmits an arbitrary signal, as shown in FIG. 13.

In some embodiments, when a length of the open stub is adjusted, a timing at which an arbitrary signal from the storage controller 210 is reflected from an end of the open stub may be adjusted.

Referring to FIG. 14, an arbitrary first signal S1 transmitted from the storage controller 210 may have an amplitude of a. Further, the first signal S1 may be reflected from the end of the open stub and thus become a second signal S2. Further, the second signal S2 as the first signal reflected from the open stub may have the same wavelength and amplitude as those of the first signal S1. In some embodiments, when the length of the open stub is adjusted, the second signal S2 as the reflected first signal may be combined with the first signal S1 in an in-phase manner. For example, when the first signal S1 is at a rising edge, the second signal S2 may be at a rising edge. When the first signal S1 is at a falling edge, the second signal S2 may be at a falling edge.

In some embodiments, the first signal S1 transmitted from the storage controller 210 and the second signal S2 as the first signal reflected from the end of the open stub may be combined with each other in the in-phase manner into a third signal S3. Therefore, using the open stub having an appropriate length as the first termination module 401 may prevent the second signal S2 as the first signal reflected from the end of the open stub from impairing the characteristics of the first signal S1 transmitted from the storage controller 210. Accordingly, the open stub may have the same improvement effect as that of each of the termination modules as described above with reference to FIGS. 4 to 12C.

Figure 15:
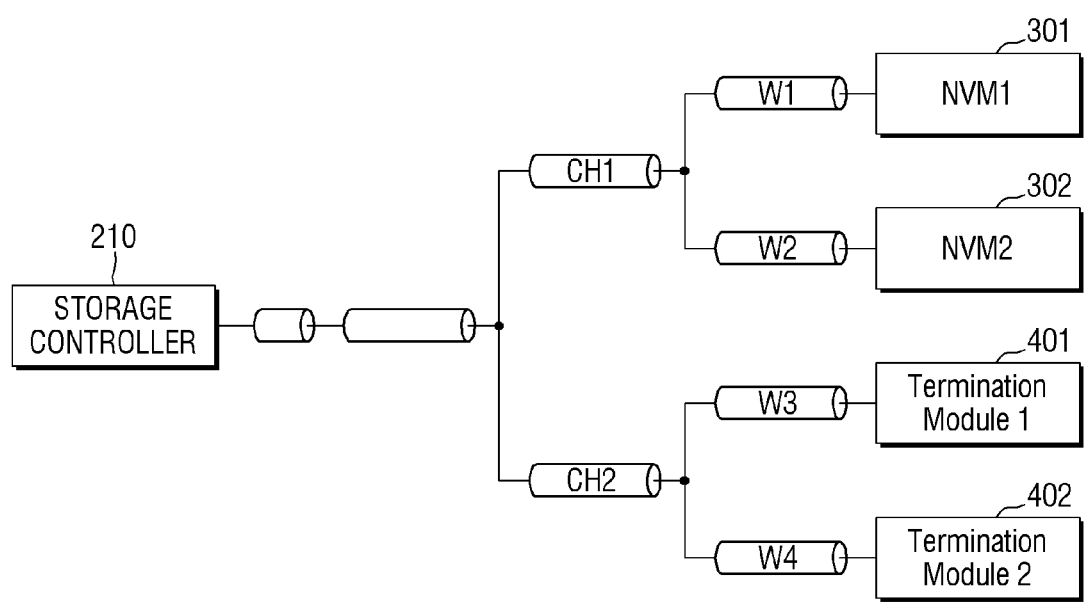
FIG. 15 is a block diagram for illustrating a storage device according to some embodiments.

FIG. 15 is a block diagram for illustrating a storage device according to some embodiments. Hereinafter, descriptions redundant with the above description will be omitted.

Referring to FIG. 15, the storage controller 210 and the first non-volatile memory device (NVM1) 301 and a second non-volatile memory device (NVM2) 302 may be connected to each other, for example, in a 1:4 multi-drop structure. For example, the storage controller 210 may be connected to the plurality of ways w1 to w4 via the two channels CH1 and CH2. In some embodiments, each of the channels CH1 and CH2 may be implemented as a strip line, and each of the ways w1 to w4 may be implemented as a micro strip line. However, embodiments are not limited thereto.

Further, in some embodiments, the first channel CH1 may be connected to the first way w1 and the second way w2, and the second channel CH2 may be connected to the third way w3 and the fourth way w4. Further, each of the first non-volatile memory device (NVM1) 301 and the second non-volatile memory device (NVM2) 302 may be connected to the first channel CH1 or the second channel CH2 via each corresponding way w1 to w4.

In some embodiments, as shown in FIG. 15, the first non-volatile memory device (NVM1) 301 may be connected to the first channel CH1 via the first way w1, while the second non-volatile memory device (NVM2) 302 may be connected to the first channel CH1 via the second way w2. Further, in some embodiments, the first termination module (Termination Module 1) 401 may be connected to the second channel CH2 via the third way w3, while a second termination module (Termination Module 2) 402 may be connected to the second channel CH2 via the fourth way w4.

Further, in some embodiments, the first termination module (Termination Module 1) 401 may be embodied as one of the CTT-type termination module, the LTT-type termination module connected to the ground voltage VSS, the LTT-type termination module connected to the power voltage VCC, or the open stub as shown in FIGS. 4 to 13. Further, the first termination module (Termination Module 1) 401 may have the same structure as that as described above in FIGS. 4 to 13.

Further, in some embodiments, the second termination module (Termination Module 2) 402 may be embodied as one of the CTT-type termination module, the LTT-type termination module connected to the ground voltage VSS, the LTT-type termination module connected to the power voltage VCC, or the open stub as shown in FIGS. 4 to 13. Further, the second termination module (Termination Module 2) 402 may have the same structure as that as described above in FIGS. 4 to 13.

Referring to FIG. 15, in some embodiments, the storage controller 210 may transmit and receive arbitrary signals to and from the first non-volatile memory (NVM1) 301 and the second non-volatile memory (NVM2) 302 in a 1:4 multi drop structure. Further, in some embodiments, the first termination module 401 and the second termination module 402 may be respectively mounted on the plurality of ways w3 and w4 of FIG. 15 on which the memory devices are not mounted, respectively. Thereafter, as described above in FIGS. 7A, 7B, 8A, and 8B, the arbitrary signals transmitted to the first non-volatile memory (NVM1) 301 and the second non-volatile memory (NVM2) 302 may have improved signal and power characteristics.

Figure 16:
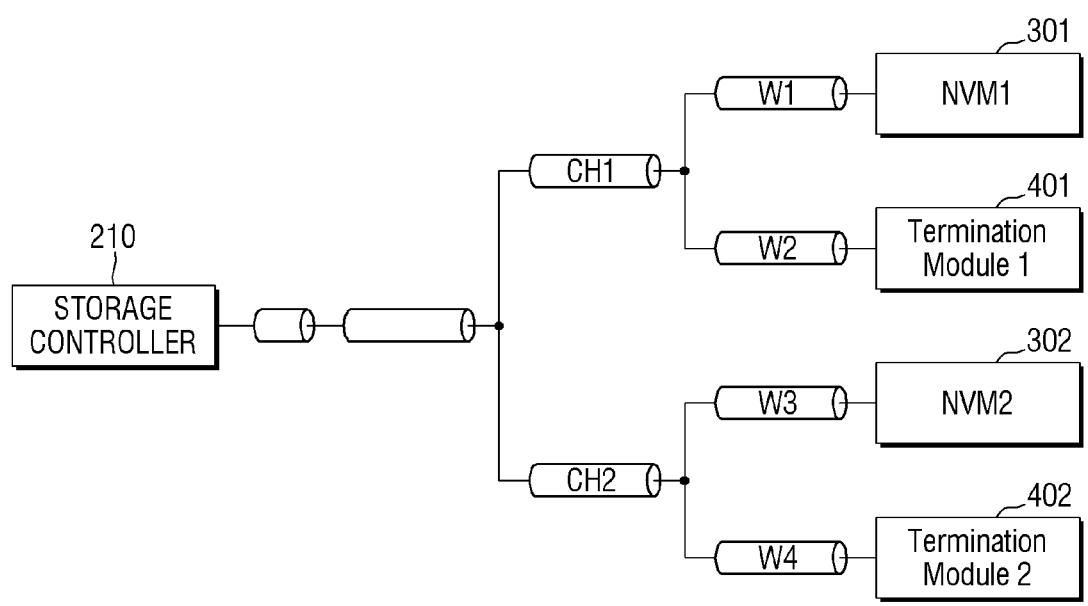
FIG. 16 is a block diagram for illustrating a storage device according to some embodiments.

FIG. 16 is a block diagram for illustrating a storage device according to some embodiments. Hereinafter, descriptions redundant with the above description will be omitted.

Referring to FIG. 16, the storage controller 210 may be connected to the first non-volatile memory device (NVM1) 301 and the second non-volatile memory device (NVM2) 302, for example, in a 1:4 multi-drop structure. For example, the storage controller 210 may be connected to the plurality of ways w1 to w4 via the two channels CH1 and CH2. In some embodiments, each of the channels CH1 and CH2 may be implemented as a strip line, and each of the ways w1 to w4 may be implemented as a micro strip line. However, embodiments are not limited thereto.

Further, in some embodiments, the first channel CH1 may be connected to the first way w1 and the second way w2, and the second channel CH2 may be connected to the third way w3 and the fourth way w4. Further, the first non-volatile memory device (NVM1) 301 and the second non-volatile memory device (NVM2) 302 may be respectively connected to the first channel CH1 and the second channel CH2 via corresponding ways w1 to w4.

In some embodiments, the first non-volatile memory device (NVM1) 301 may be connected to the first channel CH1 via the first way w1, and the second non-volatile memory device (NVM2) 302 may be connected to the second channel CH2 via the third way w3, as shown in FIG. 16. Further, in some embodiments, the first termination module (Termination Module 1) 401 may be connected to the first channel CH1 via the second way w2, and the second termination module (Termination Module 2) 402 may be connected to the second channel CH2 via the fourth way w4.

Further, in some embodiments, the first termination module (Termination Module 1) 401 may be embodied as one of the CTT-type termination module, the LTT-type termination module connected to the ground voltage VSS, the LTT-type termination module connected to the power voltage VCC, or the open stub as shown in FIGS. 4 to 13. Further, the first termination module (Termination Module 1) 401 may have the same structure as that as described above in FIGS. 4 to 13.

Further, in some embodiments, the second termination module (Termination Module 2) 402 may be embodied as one of the CTT-type termination module, the LTT-type termination module connected to the ground voltage VSS, the LTT-type termination module connected to the power voltage VCC, or the open stub as shown in FIGS. 4 to 13. Further, the second termination module (Termination Module 2) 402 may have the same structure as that as described above in FIGS. 4 to 13.

Referring to FIG. 16, in some embodiments, the storage controller 210 may transmit and receive arbitrary signals to and from the first non-volatile memory (NVM1) 301 and the second non-volatile memory (NVM2) 302 in a 1:4 multi drop structure. Further, in some embodiments, the first termination module 401 and the second termination module 402 may be respectively mounted on a plurality of ways (w2 and w4 in FIG. 16) on which the memory devices are not mounted, respectively. Thereafter, as described above in FIGS. 7A, 7B, 8A, and 8B, the arbitrary signals transmitted to the first non-volatile memory (NVM1) 301 and the second non-volatile memory (NVM2) 302 may have improved signal and power characteristics.

Figure 17:
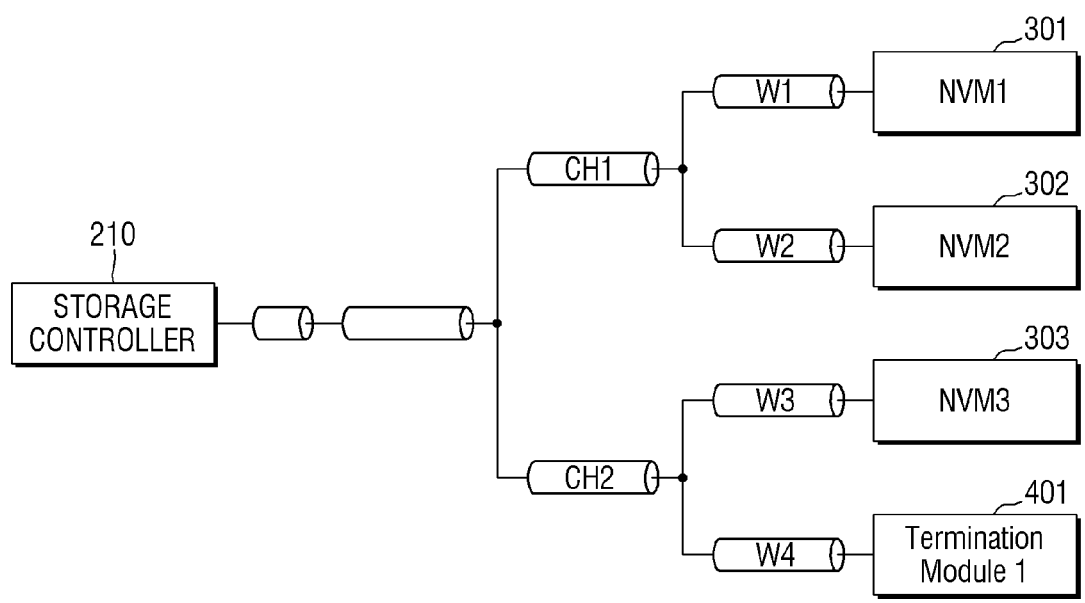
FIG. 17 is a block diagram for illustrating a storage device according to some embodiments.

FIG. 17 is a block diagram for illustrating a storage device according to some embodiments. Hereinafter, descriptions redundant with the above description will be omitted.

Referring to FIG. 17, the storage controller 210 may be connected to the first non-volatile memory device (NVM1) 301, the second non-volatile memory device (NVM2) 302, and a third non-volatile memory device (NVM3) 303, for example, in a 1:4 multi-drop structure. For example, the storage controller 210 may be connected to the plurality of ways w1 to w4 via the two channels CH1 and CH2. In some embodiments, each of the channels CH1 and CH2 may be implemented as a strip line, and each of the ways w1 to w4 may be implemented as a micro strip line. However, embodiments are not limited thereto.

Further, in some embodiments, the first channel CH1 may be connected to the first way w1 and the second way w2, and the second channel CH2 may be connected to the third way w3 and the fourth way w4. Further, each of the first non-volatile memory device (NVM1) 301, the second non-volatile memory device (NVM2) 302, and the third non-volatile memory device (NVM3) 303 may be connected to the first channel CH1 or the second channel CH2 via each corresponding way w1 to w4.

In some embodiments, as shown in FIG. 17, the first non-volatile memory device (NVM1) 301 may be connected to the first channel CH1 via the first way w1, and the second non-volatile memory device (NVM2) 302 may be connected to the first channel CH1 via the second way w2. Further, in some embodiments, the third non-volatile memory device (NVM3) 303 may be connected to the second channel CH2 via the third way w3. Further, in some embodiments, the first termination module (Termination Module 1) 401 may be connected to the second channel CH2 via the fourth way w4.

Further, in some embodiments, the first termination module 401 may be embodied as one of the CTT-type termination module, the LTT-type termination module connected to the ground voltage VSS, the LTT-type termination module connected to the power voltage VCC, or the open stub as shown in FIGS. 4 to 13. Further, the first termination module 401 may have the same structure as that as described above in FIGS. 4 to 13.

Referring to FIG. 17, in some embodiments, the storage controller 210 may transmit and receive the arbitrary signals to and from the first non-volatile memory (NVM1) 301, the second non-volatile memory (NVM2) 302, and the third non-volatile memory (NVM3) 303 in a 1:4 multi-drop structure. Further, in some embodiments, the first termination module 401 may be mounted on the fourth way (w4 in FIG. 17) on which the memory device is not mounted. Thereafter, as described above in FIGS. 7A, 7B, 8A, and 8B, the arbitrary signals transmitted to the first non-volatile memory (NVM1) 301, the second non-volatile memory (NVM2) 302, and the third non-volatile memory (NVM3) 303 may have improved signal and power characteristics.

As described hereinabove with respect to FIGS. 1 to 17, a storage device according to some embodiments of the present disclosure may include a storage controller 210 configured to output a data signal, a first non-volatile memory (NVM1) 301 configured to receive the data signal, a wiring electrically connected to the storage controller 210 and configured to transfer the data signal, a first termination module 401 including a first impedance element that electrically connects the wiring to at least one of a power voltage VCC or a ground voltage VSS, a first channel CH1 electrically connected to the wiring and configured to transfer the data signal to the first non-volatile memory (NVM1) 301, and a second channel CH2 electrically connected to the wiring and configured to transfer the data signal to the first termination module 401. The first channel CH1 may include a first way w1 that electrically connects the wiring and the first non-volatile memory (NVM1) 301 to each other, and a second way w2 electrically connected to the wiring and physically separated from the first way w1. The second channel CH2 may include a third way w3 that electrically connects the wiring and the first termination module 401 to each other, and a fourth way w4 electrically connected to the wiring and physically separated from the third way w3.

As described hereinabove with respect to FIGS. 1 to 17, a storage device according to some embodiments of the present disclosure may include a storage controller 210 configured to output a data signal, a first non-volatile memory (NVM1) 301 configured to receive the data signal, a wiring electrically connected to the storage controller 210 and configured to transfer the data signal, a first termination module 401 that electrically connects the wiring to an open stub, a first channel CH1 electrically connected to the wiring and configured to transfer the data signal to the first non-volatile memory (NVM1) 301, and a second channel CH2 electrically connected to the wiring and configured to transfer the data signal to the first termination module 401.

As described hereinabove with respect to FIGS. 1 to 17, a storage device according to some embodiments of the present disclosure may include a storage controller 210 configured to output a data signal, a first non-volatile memory (NVM1) 301 configured to receive the data signal, a wiring electrically connected to the storage controller 210 and configured to transfer the data signal, a first way w1 that electrically connects the wiring and the first non-volatile memory (NVM1) 301 to each other, a second way w2 electrically connected to the wiring and physically separated from the first way w1, a first termination module 401 including a first impedance element 410a that electrically connects the wiring to a power voltage VCC, and a second impedance element 420a that electrically connects the wiring to a ground voltage VSS, a third way w3 that electrically connects the wiring and the first termination module 401 to each other, and a fourth way w4 electrically connected to the wiring and physically separated from the third way w3.

Although the embodiments of the present disclosure have been described with reference to the accompanying drawings, the present disclosure is not limited to the above embodiments and may be implemented in various different forms. Those of ordinary skill in the art to which the present disclosure belongs will be able to understand that the present disclosure may be implemented in other specific forms without changing the technical idea or essential characteristics of the present disclosure. Therefore, it should be understood that the embodiments as described above are not restrictive but illustrative in all respects.

What is claimed is:

1. A storage device comprising:
   a storage controller configured to output a data signal;
   a first non-volatile memory configured to receive the data signal;
   a first wiring electrically connected to the storage controller and configured to transfer the data signal;
   a first termination module including a first impedance element that electrically connects the first wiring to at least one of a power voltage or a ground voltage;
   a second wiring electrically connected to the first wiring and configured to transfer the data signal to the first non-volatile memory; and
   a third wiring electrically connected to the first wiring and configured to transfer the data signal to the first termination module.

2. The storage device of claim 1, wherein the second wiring includes:
   a fourth wiring that electrically connects the first wiring and the first non-volatile memory to each other; and
   a fifth wiring electrically connected to the first wiring and physically separated from the fourth wiring,
   wherein the third wiring includes:
   a sixth wiring that electrically connects the first wiring and the first termination module to each other; and
   a seventh wiring electrically connected to the first wiring and physically separated from the sixth wiring,
   wherein the first termination module is electrically connected to the sixth wiring, and
   wherein the sixth wiring does not electrically connect the first wiring and the first non-volatile memory to each other.

3. The storage device of claim 2, further comprising:
   a second non-volatile memory electrically connected to the fifth wiring; and
   a second termination module electrically connected to the seventh wiring, wherein the second termination module includes a second impedance element that electrically connects the first wiring to at least one of the power voltage or the ground voltage.

4. The storage device of claim 3, wherein the first termination module electrically connects the first wiring to both the power voltage and the ground voltage, and
   wherein the second termination module electrically connects the first wiring to the ground voltage but not to the power voltage.

5. The storage device of claim 3, wherein the first termination module electrically connects the first wiring to the power voltage but not to the ground voltage, and
   wherein the second termination module electrically connects the first wiring to the ground voltage but not to the power voltage.

6. The storage device of claim 2, further comprising:
   a second non-volatile memory electrically connected to the fifth wiring; and
   a second termination module electrically connected to the seventh wiring, wherein the second termination module electrically connects the first wiring to an open stub.

7. The storage device of claim 6, wherein the first termination module electrically connects the first wiring to both the power voltage and the ground voltage.

8. The storage device of claim 2, further comprising:
   a second non-volatile memory electrically connected to the fifth wiring; and
   a third non-volatile memory electrically connected to the seventh wiring.

9. The storage device of claim 2, further comprising:
   a second termination module electrically connected to the fifth wiring, wherein the second termination module electrically connects the first wiring to an open stub; and
   a second non-volatile memory electrically connected to the seventh wiring.

10. A storage device comprising:
    a storage controller configured to output a data signal;
    a first non-volatile memory configured to receive the data signal;
    a first wiring electrically connected to the storage controller and configured to transfer the data signal;
    a first termination module that electrically connects the first wiring to an open stub;
    a second wiring electrically connected to the first wiring and configured to transfer the data signal to the first non-volatile memory; and
    a third wiring electrically connected to the first wiring and configured to transfer the data signal to the first termination module.

11. The storage device of claim 10, wherein the second wiring includes:
    a fourth wiring that electrically connects the first wiring and the first non-volatile memory to each other; and
    a fifth wiring electrically connected to the first wiring and physically separated from the fourth wiring, and
    wherein the third wiring includes:
    a sixth wiring that electrically connects the first wiring and the first termination module to each other; and
    a seventh wiring electrically connected to the first wiring and physically separated from the sixth wiring.

12. The storage device of claim 11, further comprising:
    a second non-volatile memory electrically connected to the fifth wiring; and a third non-volatile memory electrically connected to the seventh wiring.

13. The storage device of claim 11, further comprising a second termination module electrically connected to the seventh wiring, wherein the second termination module includes a first impedance element that electrically connects the first wiring to at least one of a power voltage or a ground voltage.

14. The storage device of claim 13, further comprising a second non-volatile memory electrically connected to the fifth wiring.

15. The storage device of claim 11, further comprising:
a second termination module electrically connected to the fifth wiring and including a first impedance element that electrically connects the first wiring to at least one of a power voltage or a ground voltage; and
a second non-volatile memory electrically connected to the seventh wiring.

16. A storage device comprising:
a storage controller configured to output a data signal;
a first non-volatile memory configured to receive the data signal;
a first wiring electrically connected to the storage controller and configured to transfer the data signal;
a second wiring that electrically connects the first wiring and the first non-volatile memory to each other;
a third wiring electrically connected to the first wiring and physically separated from the second wiring;
a first termination module including a first impedance element that electrically connects the first wiring to a power voltage, and a second impedance element that electrically connects the first wiring to a ground voltage;
a fourth wiring that electrically connects the first wiring and the first termination module to each other; and
a fifth wiring electrically connected to the first wiring and physically separated from the fourth wiring.

17. The storage device of claim 16, further comprising:
a second non-volatile memory electrically connected to the third wiring; and
a second termination module electrically connected to the fifth wiring, wherein the second termination module includes a third impedance element that electrically connects the first wiring to the ground voltage but not to the power voltage.

18. The storage device of claim 16, further comprising:
a second non-volatile memory electrically connected to the third wiring; and
a second termination module electrically connected to the fifth wiring, wherein the second termination module includes a third impedance element that electrically connects the first wiring to the power voltage but not to the ground voltage.

19. The storage device of claim 16, further comprising:
a second non-volatile memory electrically connected to the third wiring; and
a second termination module electrically connected to the fifth wiring, wherein the second termination module electrically connects the first wiring to an open stub.

20. The storage device of claim 16, further comprising:
a second non-volatile memory electrically connected to the third wiring; and
a third non-volatile memory electrically connected to the fifth wiring.

* * * * *